United States Patent
van Dijk et al.

(10) Patent No.: US 9,891,249 B2
(45) Date of Patent: *Feb. 13, 2018

(54) BROAD-RANGE CURRENT MEASUREMENT USING DUTY CYCLING

(71) Applicant: NXP B.V., Eindhoven (NL)

(72) Inventors: Luc van Dijk, Kranenburg (DE); Cornelis Klaas Waardenburg, Zeeland (NL)

(73) Assignee: NXP B.V., Eindhoven (NL)

( * ) Notice: Subject to any disclaimer, the term of this patent is extended or adjusted under 35 U.S.C. 154(b) by 652 days.

This patent is subject to a terminal disclaimer.

(21) Appl. No.: 14/289,397

(22) Filed: May 28, 2014

(65) Prior Publication Data

US 2015/0346239 A1 Dec. 3, 2015

(51) Int. Cl.
| | |
|---|---|
| *G01R 15/09* | (2006.01) |
| *G01R 1/30* | (2006.01) |
| *G01R 19/00* | (2006.01) |
| *H03K 17/082* | (2006.01) |
| *G01R 19/165* | (2006.01) |
| *G01R 31/00* | (2006.01) |

(52) U.S. Cl.
CPC ......... *G01R 15/09* (2013.01); *G01R 19/0092* (2013.01); *H03K 17/0822* (2013.01); *G01R 19/16519* (2013.01); *G01R 31/006* (2013.01); *H03K 2217/0027* (2013.01)

(58) Field of Classification Search
None
See application file for complete search history.

(56) References Cited

U.S. PATENT DOCUMENTS

| | | | | |
|---|---|---|---|---|
| 5,646,520 A | * | 7/1997 | Frank | G01R 19/0092 324/118 |
| 5,841,649 A | | 11/1998 | Willett et al. | |
| 6,479,975 B1 | * | 11/2002 | Plankensteiner | G01R 19/16519 323/313 |

(Continued)

FOREIGN PATENT DOCUMENTS

| | | |
|---|---|---|
| CN | 102830320 A | 12/2012 |
| CN | 103095263 A | 5/2013 |

(Continued)

OTHER PUBLICATIONS

Extended European Search Report for EP Patent Appln. No. 15168885.0 (dated Nov. 9, 2015).

(Continued)

*Primary Examiner* — Jermele M Hollington
*Assistant Examiner* — Suresh Rajaputra
(74) *Attorney, Agent, or Firm* — Rajeev Madnawat

(57) ABSTRACT

An apparatus, method and integrated circuit for broad-range current measurement using duty cycling are disclosed. Embodiments of an apparatus for sensing current through a transistor device may include an interface configured to receive a current from the transistor device for sensing. Additionally, embodiments may include a sensor component coupled to the interface and configured to receive the current from the transistor device and to generate a responsive sensor voltage. Embodiments may also include a sense control circuit configured to control a duty cycle of the sensor component.

19 Claims, 6 Drawing Sheets

(56) References Cited

U.S. PATENT DOCUMENTS

| | | | | |
|---|---|---|---|---|
| 6,788,088 | B2* | 9/2004 | Throngnumchai | H02M 1/32 324/126 |
| 7,126,354 | B2* | 10/2006 | Deboy | G01R 19/0092 323/316 |
| 7,276,893 | B2* | 10/2007 | Banaska | G01R 15/09 324/115 |
| 7,345,499 | B2* | 3/2008 | Billingsley | G01R 1/203 361/101 |
| 7,352,202 | B2* | 4/2008 | Billingsley | G01R 1/203 324/754.05 |
| 8,169,224 | B2* | 5/2012 | Sander | G01R 19/0092 323/315 |
| 8,373,449 | B2 | 2/2013 | Thiele et al. | |
| 8,698,470 | B2* | 4/2014 | Ju | H02M 3/156 323/284 |
| 9,153,974 | B2* | 10/2015 | Reynolds | H02J 7/0016 |
| 9,194,893 | B2* | 11/2015 | Chuah | G01R 19/0092 |
| 9,594,097 | B2 | 3/2017 | Bogner et al. | |
| 2002/0002437 | A1 | 2/2002 | Sander | |
| 2002/0024376 | A1* | 2/2002 | Sander | G01R 19/0092 327/407 |
| 2002/0158615 | A1* | 10/2002 | Goodfellow | G01R 19/16519 323/315 |
| 2002/0179443 | A1* | 12/2002 | Hada et al. | G01N 27/406 204/408 |
| 2004/0227539 | A1* | 11/2004 | Thiery | G01R 19/0092 324/762.09 |
| 2006/0025153 | A1 | 11/2006 | Colbeck | |
| 2006/0250153 | A1* | 11/2006 | Colbeck | G01R 19/0092 324/762.09 |
| 2007/0103005 | A1* | 5/2007 | Nagasawa | H02M 3/156 307/125 |
| 2008/0231246 | A1* | 9/2008 | Sugie | G11B 19/28 323/284 |
| 2008/0246460 | A1* | 10/2008 | Smith | G01R 19/003 324/76.11 |
| 2009/0146620 | A1* | 6/2009 | Ng | G01R 19/0092 323/222 |
| 2010/0052611 | A1* | 3/2010 | Lyle, Jr. | H02M 3/156 320/111 |
| 2010/0060257 | A1* | 3/2010 | Azrai | G01R 19/0092 324/76.11 |
| 2011/0221421 | A1* | 9/2011 | Williams | H01L 23/49575 324/76.11 |
| 2012/0169377 | A1* | 7/2012 | Thiele | G01R 19/0092 327/50 |
| 2012/0319677 | A1* | 12/2012 | Bogner | G01R 1/20 324/126 |
| 2013/0083434 | A1* | 4/2013 | Barth | H02P 8/02 361/31 |
| 2013/0181723 | A1* | 7/2013 | Mauder | G01R 19/0092 324/601 |
| 2014/0266832 | A1* | 9/2014 | Schrom | H02M 3/157 341/144 |
| 2014/0334051 | A1* | 11/2014 | Yagyu | H02H 9/02 361/93.1 |
| 2015/0346239 | A1 | 12/2015 | Van Dijk et al. | |
| 2015/0346241 | A1 | 12/2015 | Van Dijk et al. | |

FOREIGN PATENT DOCUMENTS

| | | |
|---|---|---|
| CN | 105137146 A | 12/2015 |
| CN | 105137159 A | 12/2015 |
| DE | 102 40 914 A1 | 3/2004 |
| DE | 10 2008 032 556 B3 | 9/2009 |
| EP | 0 743 751 A2 | 11/1996 |
| JP | 5203698 A | 8/1993 |
| JP | 2001-345686 A | 12/2001 |
| JP | 2003299363 A | 10/2003 |
| JP | 2006242937 A | 9/2006 |
| JP | 2006250831 A | 9/2006 |
| JP | 2011149926 A | 8/2011 |
| WO | 2013094148 A1 | 6/2013 |

OTHER PUBLICATIONS

Cheung, F. L. et al. "On-Chip Current Sensing Technique for CMOS Monolithic Switch-Mode Power Converters", IEEE Intl. Symp. on Circuits and Systems, vol. 5, pp. V-265-V-268 (2002).

Extended European Search Report for EP Patent Appln. No. 15169365.2 (dated Nov. 2, 2015).

Lee, Cheung Fai et al. "On-chip current sensing technique for CMOS monolithic switch-mode power converters", IEEE International Symposium on Circuits and Systems, pp. V-265-V-268 vol. 5. (2002).

* cited by examiner

BROAD-RANGE CURRENT MEASUREMENT USING DUTY CYCLING

In certain circuits, it is useful to be able to accurately sense a large current through a transistor device, such as a Metal-Oxide-Semiconductor Field Effect Transistor (MOSFET), over a wide current range. High accuracy sensing over a wide current range may be particularly useful in automotive applications because of the high current battery supply used therein. In order to maintain a certain level of efficiency, it is desirable to sense the current without causing substantial losses due to the sensing mechanism.

Most known sensing techniques involve providing a sense MOSFET coupled to the main MOSFET device to draw a small sensor current that is proportional to the main current. Generally, the sense MOSFET is smaller than the main MOSFET device by a particular ratio, which defines the proportion of current drawn by the sense MOSFET. In order to achieve accurate sensing, the ratio is typically low. However, the ratio should be high in order to achieve high efficiency. High efficiency typically means that the sense MOSFET causes very low power losses. Thus, there is a difficult design tradeoff between accuracy and efficiency in known current sensor circuits.

Current sense MOSFETS have typically only been used as a single point fuse at high current, or for sensing current over a very small range. Moreover, known current sense circuits fail to adequately resolve the heavy tradeoff between accuracy and efficiency. Thus, current sensing has been limited to a narrow range of measurable currents and the resolution available has been very low.

Apparatuses, methods and integrated circuits for broad-range current measurement using duty cycling are disclosed. Embodiments of an apparatus for sensing current through a transistor device may include an interface configured to receive a current from the transistor device for sensing. Additionally, embodiments may include a sensor component coupled to the interface and configured to receive the current from the transistor device and to generate a responsive sensor voltage. Embodiments may also include a sense control circuit configured to control a duty cycle of the sensor component.

Embodiments of an integrated circuit for sensing current through a transistor device may include an interface configured to receive a current from the transistor device for sensing. Additionally, the integrated circuit may include a sensor component coupled to the interface and configured to receive the current from the transistor device and to generate a responsive sensor voltage. The integrated circuit may also include a sense control circuit configured to control a duty cycle of the sensor component.

Embodiments of methods for sensing current through a transistor device may include receiving a current from the transistor device for sensing at an interface configured to receive the current from the transistor device. Additionally, embodiments may include generating a sensor voltage with a sensor component, the sensor voltage being responsive to the current from the transistor device. Embodiments may also include controlling a duty cycle of the sensor component with a sense control circuit.

Other aspects in accordance with the invention will become apparent from the following detailed description, taken in conjunction with the accompanying drawings, illustrated by way of example of the principles of the invention.

Throughout the description, similar reference numbers may be used to identify similar elements.

Figure 1:
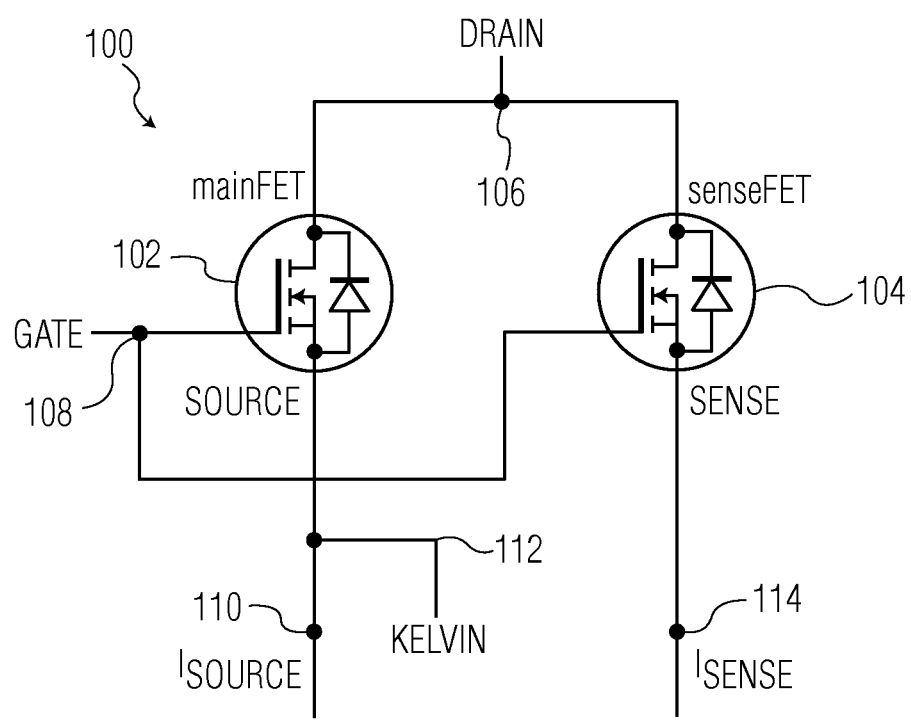
FIG. 1 depicts a schematic circuit diagram of one embodiment of a transistor circuit with a current sense transistor.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

While many embodiments are described herein, at least some of the described embodiments enable broad-range current measurement using duty cycling for a transistor device, such as a power MOSFET. Advantageously, such embodiments allow accurate and high resolution current measurement. Additionally, such embodiments may be very efficient because the current draw is relatively low. In particular, measurement of the current on a duty cycle may reduce the power consumption due to measurement by the duty cycle ratio and thereby increase efficiency of the system.

Embodiments of devices for broad-range current measurement using duty cycling may be implemented in a number of different types of electronic devices. Some examples of electronic devices include semiconductor devices for automotive or marine applications, controllers for factory automation systems, components of alternative power systems, etc. There is no limitation on the general types of applications that might incorporate embodiments of the technology described herein.

Advantages of the present embodiments include an ability to provide current sensing in a single sensor circuit that exhibits both high accuracy and high efficiency. Another advantage is that the present embodiments do not require a large circuit footprint, since an Analog to Digital Converter (ADC) may be shared amongst multiple channels. Additionally, the circuit footprint required for digital level shifters between high side domains and low-side domain may be reduced because the level shifters may be functionally replaced by components of the sensor circuitry.

FIG. 1 depicts a schematic circuit diagram of one embodiment of a transistor circuit 100. In an embodiment, the transistor circuit 100 includes a main transistor 102 and a sense transistor 104. The main transistor 102 may be, for example, a MOSFET device. In a further embodiment, the MOSFET device may be a power MOSFET configured to conduct high currents for automotive applications, for example. The sense transistor 104 may also be a MOSFET device.

In an embodiment, the main transistor 102 and the sense transistor 104 are each connected to a drain node (D) 106 and a gate node (G) 108. In an embodiment, the main transistor 102 includes a Kelvin node (K) 112 for providing an accurate measurement of the potential at a source node 110 of the main transistor 102. Additionally, the sense transistor 104 may provide a sense current to a sense current node ($I_{SENSE}$) 114.

The embodiment of FIG. 1 provides a main transistor 102 configured to conduct a current ($I_{SOURCE}$) and a sense transistor 104 configured to provide a measurable sense current ($I_{SENSE}$), which may be a portion of the current ($I_{SOURCE}$), for external sensing. In the described embodiment, the sense transistor 104 may be configured to provide a sense current that is smaller than the main current by a predetermined ratio. For example, the ratio may be determined by the relative size of the main transistor 102 and the sense transistor 104. If, for example, the main transistor 102 is n times larger than the sense transistor 104, the sense transistor 104 may be configured to provide a sense current that is $1/n^{th}$ of the main current.

Figure 2:
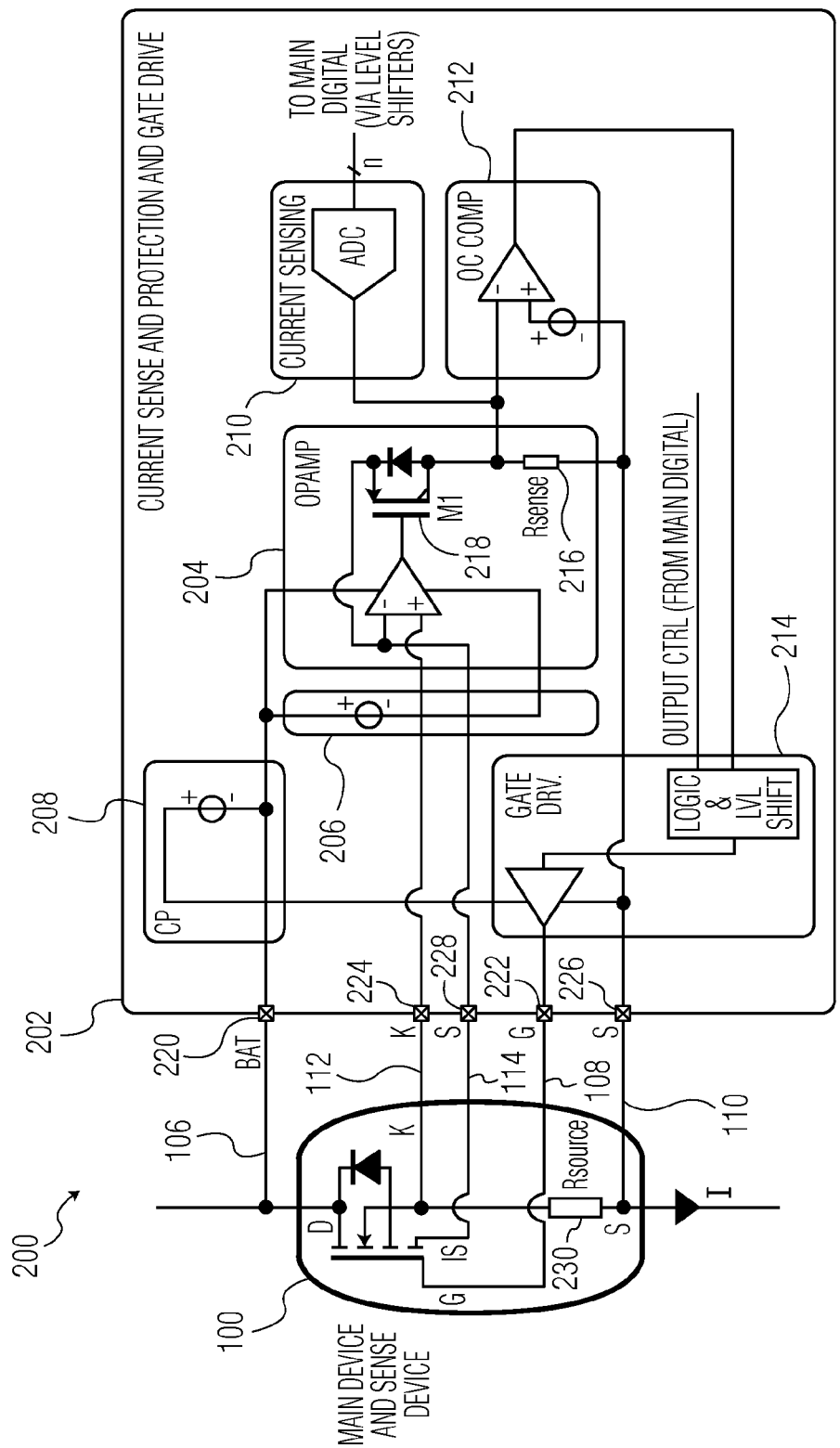
FIG. 2 depicts a schematic block diagram of an embodiment of a system for sensing a current in a transistor device.

FIG. 2 depicts a schematic block diagram of a system 200 for sensing a current in the transistor circuit 100. In one embodiment, the system 200 is implemented in an integrated circuit. In an embodiment, the transistor circuit 100 is a MOSFET configured to conduct a main current ($I_{SOURCE}$) as illustrated in FIG. 1. The transistor circuit 100 may include both the main transistor 102 and the sense transistor 104 as described in FIG. 1. In such an embodiment, the main transistor 102 and the sense transistor 104 may be integrated into a transistor device package as illustrated by the transistor circuit 100 in FIG. 2.

In an embodiment, the system 200 includes a current sense device 202. The current sense device 202 may be coupled to the transistor circuit 100. For example, the current sense device may include a battery interface 220 for coupling to the drain node 106 of the transistor device. Additionally, the current sense device 202 may include a gate interface 222, a source interface 226, a Kelvin interface 224, and a sense current interface 228, each configured to be respectively coupled to the gate node 108, the source node 110, the Kelvin node 112, and the sense current node 114 of the transistor circuit 100. In an embodiment, the current sense device 202 may be a stand-alone integrated circuit device having I/O pins corresponding to the gate interface 222, the source interface 226, the Kelvin interface 224, and the sense current interface 228.

In an embodiment, the sense device includes an OPAMP 204 configured to force the voltage on the Kelvin interface 224 and the sense current interface 228 to be equal, such that the main transistor 102 and the sense transistor 104 operate on the same gate-source voltage difference. Because Gate-source voltages of the main transistor 102 and the sense transistor 104 are equal, a current n times smaller than the current that flows through the main transistor 102 will flow through the sense transistor 104, when the sense transistor 104 is n times smaller than the main device 102, and is sensed in the current sense device 202. In an embodiment, the sense current will flow through transistor (M1) 218 and generate a large voltage across the sense resistor 216 that can be further processed. Although the illustrated current sense device 202 is shown with certain components and described with certain functionality herein, other embodiments of semiconductor chips and corresponding systems may include fewer or more components to implement the same, less, or more functionality.

In an embodiment, the gate driver 214 drives the gate node 108 of the transistor circuit 100. The Charge Pump (CP) 208 may be configured to provide a voltage supply for the transistor circuit 100, which may include one or more NMOSFET devices configured to operate in a high-side configuration. In a high-side configuration, the gate voltage may be larger than the supply voltage (battery voltage, VBAT), which is generated by the charge pump 208. In an embodiment, the Overcurrent Comparator (OC Comp) 212 detects a current larger than the nominal current range. In an embodiment, the overcurrent may be detected by a voltage comparator between the battery terminal 220 and the source terminal 226. In an embodiment, a current sensing block 210 may include an Analog to Digital Converter (ADC) configured to convert a current sense voltage at the sense resistor 216 into digital sensor data that can be used by external digital components, such as digital controllers.

Figure 3:
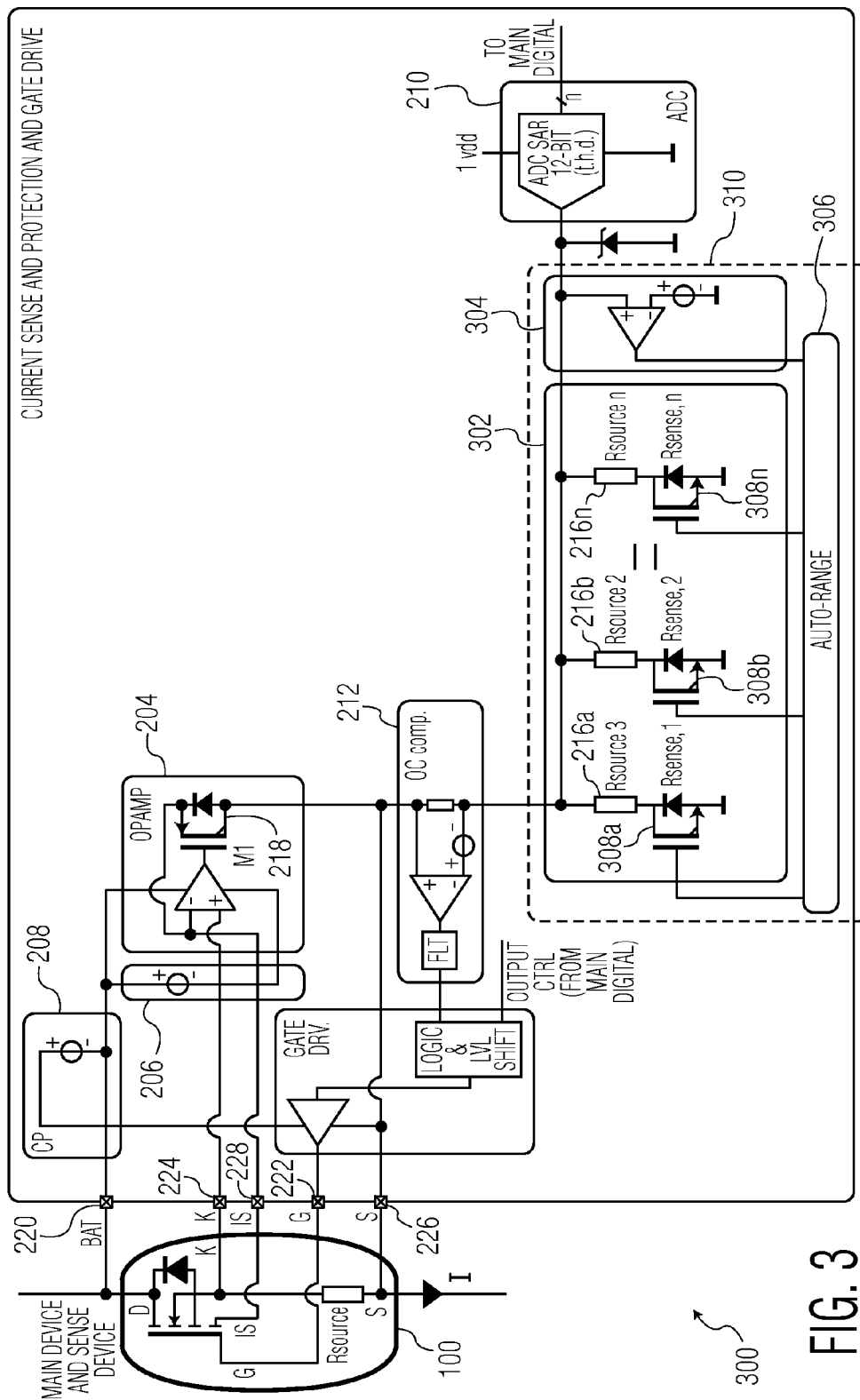
FIG. 3 depicts a schematic block diagram of an embodiment of a system for broad-range current measurement using duty cycling.
Figure 4:
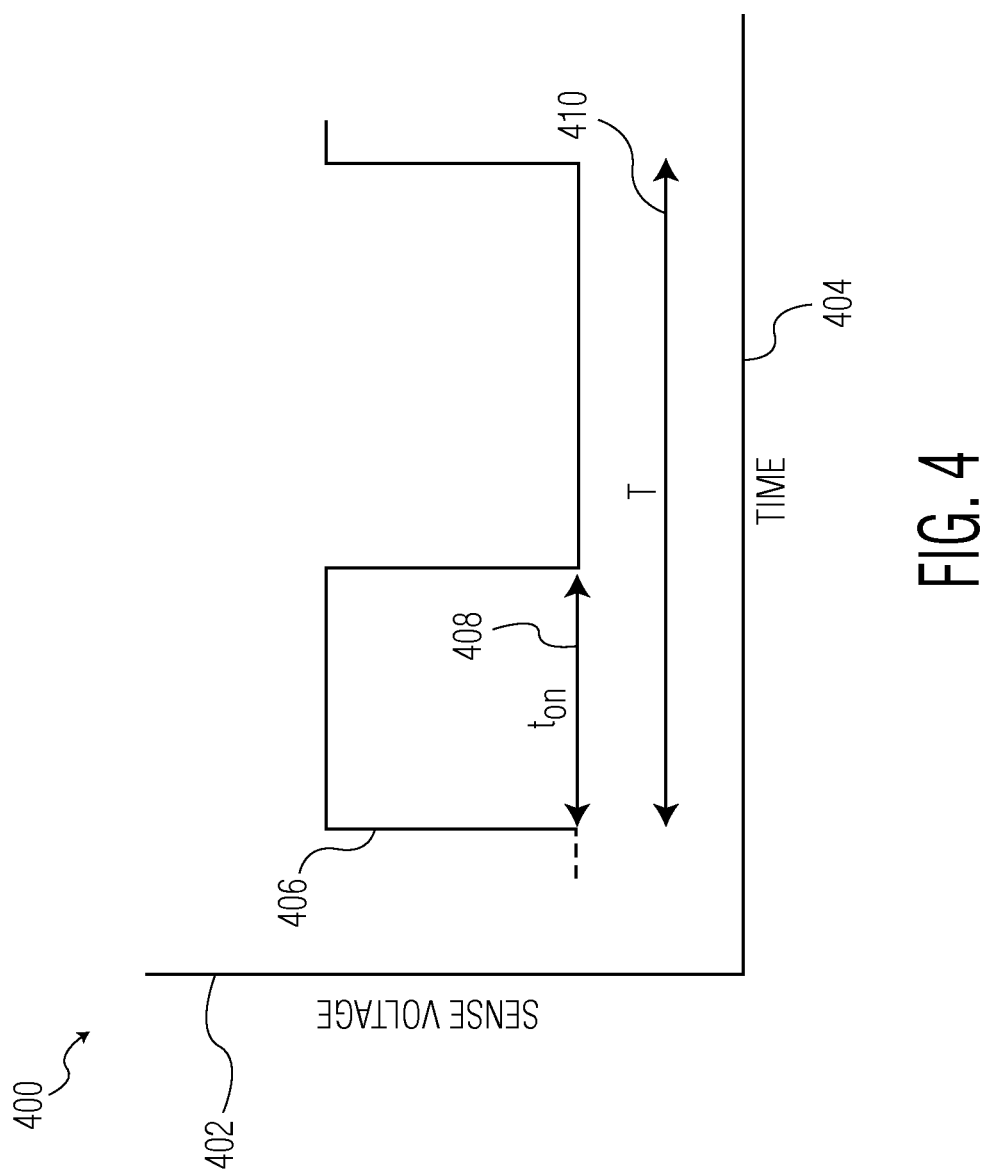
FIG. 4 illustrates an embodiment of a duty cycle for broad-range current measurement using duty cycling.

In the embodiment of FIG. 2, the voltage across the source resistance (Rsource) 230 may be low (I*Rsource) as compared with the embodiments of FIGS. 3-4. For example, the voltage across Rsource 230 can be as low as 5 μV up to about 20 mV in some embodiments. In such embodiment, the voltage across Rsource 230 is not only at the non-inverting input of the OPAMP 204, but also at the inverting input of OPAMP 204, which also represents the full headroom available for M1 218 and the sense resistor Rsense 216. Therefore, the voltage across the sense resistor 216 is effectively lower than the levels at Rsource 230. For example, the voltage at the sense resistor 216 may only be half of the voltage at Rsource 230. Therefore, it may be challenging to design circuitry for sensing voltages between 5 μV and 10 mV with high accuracy and high resolution.

FIG. 3 illustrates another embodiment of a system 300 for broad-range current measurement using duty cycling. In system 300, the OPAMP 204 forces the voltage levels at the K interface 224 and the sense current interface 228 to be equal. The sense current may be n times smaller than the main current (I), and may flow to ground via sense resistors 216a-n (Rsense1, . . . n) in sensor component 302. In such an embodiment, the voltage level across the sense resistor(s) 216a-n in sensor component 302 may be significantly higher than in the circuit 200 of FIG. 2. In such an embodiment, the sensor device 202 may be less sensitive to EMC exposure.

In a further embodiment, a sense control circuit 310 may configure the sensor component 302 such that the resistance of the sensor component 302 is adjusted in value depending on the absolute value of the current (I) and the sense current (I/n). In a further embodiment, the sense control circuit 310 may include a reference comparator 304 and an auto-range circuit 306. Such an embodiment, with adjustable resistance, will allow the measurement over a wide current range with high accuracy and resolution.

For example, the reference comparator 304 may be configured to compare the output voltage of the sensor component 302 to a reference voltage and provide feedback to the auto-range circuit 306. In one embodiment, the voltage may be 1.8 V. One of ordinary skill, however, will recognize other suitable reference voltages that may be used. The auto-range circuit 306 may then cause another sense resistor 216a-n in the sensor component 302 to be activated. For example, the auto-range circuit 306 may apply a voltage to a switch transistor 308a-n (Mrange1, . . . n) causing current to flow through the corresponding sense resistor 216a-n.

In one such example, a sense current may be received at the sense current interface 228 and conducted through transistor 218 (M1) to sensor component 302. A first switch transistor 308a (Mrange1) may be activated causing the current to flow through the corresponding first sense resistor 216a. The reference comparator 304 may compare the voltage across the first sense resistor 216a with the reference voltage and determine that the voltage on the first sense resistor 216a is too high. In response, a feedback signal may be sent to sense control circuit 310, which causes auto-range circuit 306 to deactivate the first switch transistor 308a and activate the second switch transistor 308b. Activating the second switch transistor 308b may then cause the current to flow through the second sense resistor 216b, which may have a different resistance value than the first sense resistor 216a. Thus, the resistance value of the sensor component 302 may be automatically adjusted or scaled according to the value of the current received at the sense current interface 228. In an alternative embodiment, the switch transistors 308a-n may be activated in parallel, rather than in sequence.

Such embodiments may meet high accuracy requirements, but still dissipate unacceptable amounts of power. In an embodiment, the dissipation caused by the sensing circuitry can be expressed as:

$$P_{diss} = I/n * V_{BAT} \quad (1)$$

where $V_{BAT}$ is the voltage level at the battery interface 220. In certain embodiments, the power dissipation may be high where the value of n in the ratio I/n is low for enhanced accuracy.

In certain embodiments, a duty cycle based measurement, as described with reference to FIG. 4, may be implemented that reduces the dissipation of power in the current sense component 302 by the duty cycle ratio according to the following equation:

$$P_{diss} = \delta * (I/n * V_{BAT}) \quad (2)$$

where δ describes a duty cycle ratio, which is a portion of a total measurement period (T) where the sensor is activated ($t_{on}$).

As illustrated in FIG. 4, the sense component 302 may be activated and deactivated periodically. For example, the graph of FIG. 4 illustrates the sensor output voltage 402 verses time 404. The sensor component 302 may generate a sensor output signal 406 which is activated for a portion 408 ($t_{on}$) of the period 410 (T) and deactivated for the remainder of the period 410. In such an embodiment, the auto-range circuit 306 may control the duty cycle of the sensor component 302 by periodically switching the switch transistors 308a-n on and off according to a preconfigured duty cycle period. For example, in an embodiment the auto-range circuit 306 may be pre-configured to control the duty cycle of the sensor component 302 according to a predetermined duty cycle function.

In an embodiment, the duty cycle based measurement may not detrimentally affect accuracy, because the size ratio n may not be decreased by decreasing the size of the sense MOSFET. Rather, the ratio n may be effectively increased by the duty cycle based measurement. In such an embodiment, both accuracy and resolution parameters may be improved as compared to other systems.

In certain embodiments, duty cycle based sensing will decrease the reaction speed of the current sense device 202 on changes in the main current ($I_{SOURCE}$). Nonetheless, duty cycle ratios as low as 40% may be suitable for use with the present embodiments.

Figure 5:
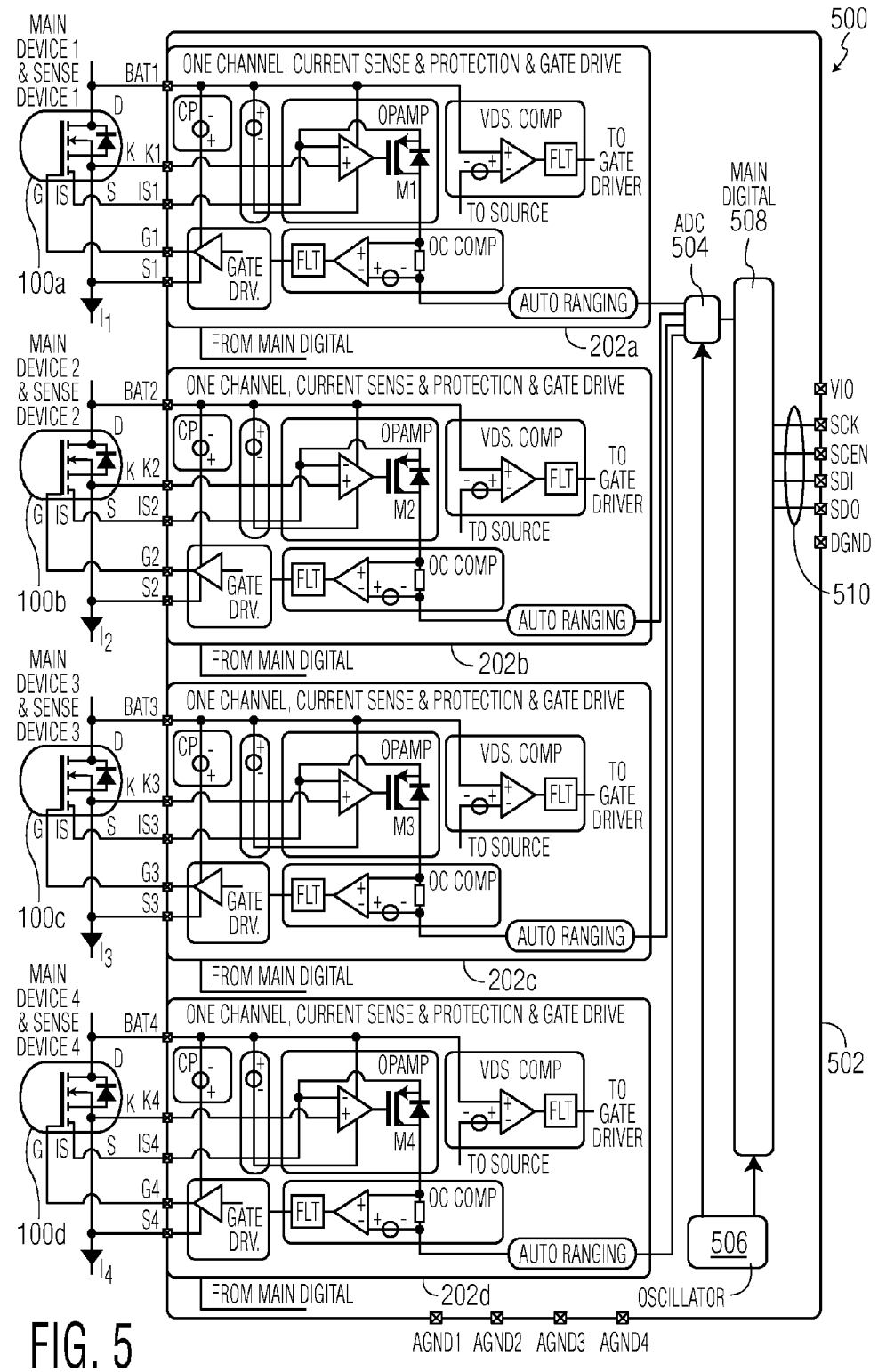
FIG. 5 depicts a schematic block diagram of an embodiment of a system for multi-channel current sensing.

FIG. 5 depicts a system 500 having a four channel high accuracy, high efficiency current measurement device 502. In an embodiment, the four channel current measurement device 502 may sense the current I1 . . . I4 through four individual channels with high accuracy and high efficiency. In an embodiment, each channel is coupled to a separate transistor circuit 100. For example, a first transistor circuit 100a may be coupled to a first current sensing device 202a, a second transistor circuit 100b may be coupled to a second current sensing device 202b, a third transistor circuit 100c may be coupled to a third current sensing device 202c, and a fourth transistor circuit 100d may be coupled to a fourth current sensing device 202d. Additionally, each channel may include a current sensing device 202a-d, each being coupled to a shared ADC 504, which is a more area effective solution compared with a single ADC 210 per channel.

In a further embodiment, the digital output of the shared ADC 504 may be communicated to a main digital block 508. The main digital block 508 may use frequency information generated by the oscillator 506 to reformat the digital sensor signals for communication to an external microprocessor over, for example, a Serial Peripheral Interface (SPI) bus interface 510, which may include multiple discrete lines in one embodiment. In an embodiment, the current measurement device 502 may be a stand-alone integrated circuit device.

Figure 6:
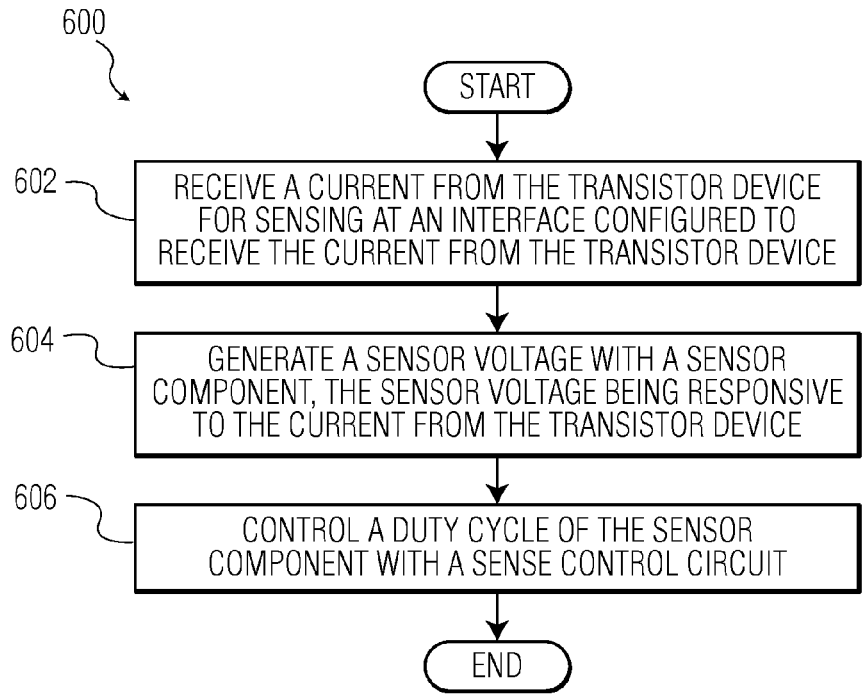
FIG. 6 depicts a flowchart diagram illustrating one embodiment of a method for broad-range current measurement using duty cycling.

FIG. 6 depicts a flowchart diagram of one embodiment of a method 600 for broad-range current measurement using duty cycling. In an embodiment, the method 600 starts at block 602 with receiving a current from the transistor device for sensing at an interface configured to receive the current from the transistor device. At block 604, the method includes generating a sensor voltage with a sensor component, the sensor voltage being responsive to the current from the transistor device. At block 606, the method includes controlling a duty cycle of the sensor component with a sense control circuit.

For example, gate driver 214 may drive a voltage at the gate node 108 causing current $I_{SOURCE}$ to flow from the battery interface 220 through the main transistor 102 to the source node 110, as shown at block 602. In an embodiment, the sense transistor 104 may simultaneously conduct the sense current $I_s$ to the sense current node 114. The sense current $I_{SENSE}$ may then flow through sense current interface 228 to the inverting terminal of OPAMP 204 and through sensor transistor 218. In an embodiment, the sense current only flows through sensor transistor 218 when the potential energy at the K terminal 224 and the sense current interface 228 is equal. In such an embodiment, the current flows through sensor transistor 218 to sensor component 302, where a voltage is established over the one or more sensor resistors 216a-n (Rsense1, ... n). The voltage is then converted by ADC 210 and provided as digital sensor data to an external component.

In a further embodiment, the sensing may be duty cycled as described with reference to FIG. 4. For example, the voltage may only be sensed during the $t_{on}$ portion 408 of the sensing period 410 as controlled by the duty cycle settings of the sense control circuit 310. In still a further embodiment, multiple currents may flow through multiple transistor circuits 100a-d and sensed by a multi-channel current sensor device 502 as described with reference to FIG. 5.

Figure 7:
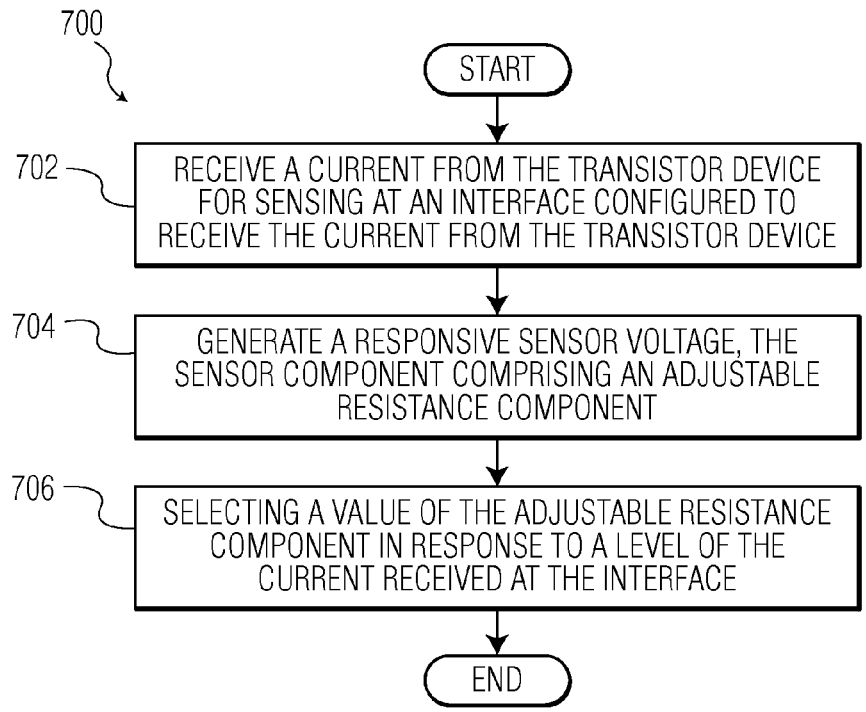
FIG. 7 depicts a flowchart diagram illustrating another embodiment of a method for broad-range current measurement using duty cycling.

FIG. 7 illustrates another embodiment of a method 700 for broad-range current measurement using duty cycling. In an embodiment, the method 700 starts at block 702, by receiving a current from the transistor device for sensing at an interface configured to receive the current from the sensor device. At block 704, the method includes generating a responsive sensor voltage with a sensor component, the sensor component comprising an adjustable resistance component. The method 700 further includes selecting a value of the adjustable resistance component in response to a level of the current received at the interface, as shown at block 706.

It should also be noted that at least some of the operations for the methods described herein may be implemented using firmware or software instructions stored on a readable storage medium for execution by a programmable logic device, such as an Application Specific Integrated Circuit (ASIC), a Field Programmable Gate Array (FPGA), a Programmable Logic Chip (PLC), a processor, or the like. As an example, an embodiment of a program product includes a firmware package stored on a flash memory device and configured to cause an FPGA to perform the operations described herein.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. An apparatus for sensing current through a transistor device, comprising:
   an interface configured to receive a current from the transistor device for sensing;
   a sensor component coupled to the interface and configured to receive the current from the transistor device and to generate a responsive sensor voltage; and
   a sense control circuit configured to control a duty cycle of the sensor component according to a duty cycle ratio which is a portion of a total measurement period for which the sensor component is activated.

2. The apparatus of claim 1, wherein the sensor component comprises an adjustable resistance component, a resistance value of the adjustable resistance component being selectable in response to a level of the current received at the interface.

3. The apparatus of claim 2, wherein the sense control circuit further comprises an automatic ranging device configured to automatically scale the resistance in response to a magnitude value of the current.

4. The apparatus of claim 3, wherein the automatic ranging device is configured to switch the current to a resistor in the sense component on and off according to the duty cycle of the sensor component.

5. The apparatus of claim 2, wherein the sense control circuit further comprises a comparator configured to trigger adjustment of the adjustable resistance component in response to an output voltage of the sensor component crossing a threshold set by a reference voltage.

6. An integrated circuit for sensing current through a transistor device, the integrated circuit comprising:
   an interface configured to receive a current from the transistor device for sensing;
   a sensor component coupled to the interface and configured to receive the current from the transistor device and to generate a responsive sensor voltage; and
   a sense control circuit configured to control a duty cycle of the sensor component according to a duty cycle ratio which is a portion of a total measurement period for which the sensor component is activated.

7. The integrated circuit of claim 6, wherein the sense control circuit further comprises an automatic ranging device configured to automatically scale the resistance in response to a magnitude value of the current.

8. The integrated circuit of claim 7, wherein the automatic ranging device is configured to switch the current to a resistor in the sense component on and off according to the duty cycle of the sensor component.

9. The integrated circuit of claim 7, wherein the sense control circuit further comprises a comparator configured to trigger adjustment of the adjustable resistance component in response to an output voltage of the sensor component crossing a threshold set by a reference voltage.

10. The integrated circuit of claim 6, wherein the interface comprises:
    a gate node interface configured interface with a gate node of the transistor device;
    a drain node interface configured to interface with a drain node of the transistor device;
    a source node interface configured to interface with a source node;

a Kelvin node interface configured to interface with a Kelvin node of the transistor device; and a sense current node interface configured to receive the current from a sense current node of the transistor device, the current being a sense current that is smaller than a main current that flows through the transistor device by a predetermined ratio.

11. The integrated circuit of claim 10, further comprising an Operational Amplifier (OPAMP) coupled to the sense node interface and the Kelvin node interface and configured to force a voltage value at the sense node interface and at the Kelvin node interface to equal levels.

12. The integrated circuit of claim 11, further comprising a current sense transistor coupled to the OPAMP, the current sense transistor configured to drive a current to the sensor component for generating a sensor voltage across the current sense component.

13. The integrated circuit of claim 6, wherein the integrated circuit further comprises:

a plurality of interfaces, each interface configured to receive a current from one of a plurality of transistor devices for sensing;

a plurality of sensor components, each coupled to one of the plurality of interfaces; and a shared Analog to Digital (ADC) converter coupled to each of the plurality of sensor components, the ADC converter configured to convert analog sensor data into digital sensor data.

14. The integrated circuit of claim 13, further comprising a digital format converter configured to reformat the digital sensor data into a digital data format that is readable by an external data processing device.

15. A method for sensing current through a transistor device, the method comprising:

receiving a current from the transistor device for sensing at an interface configured to receive the current from the transistor device;

generating a sensor voltage with a sensor component, the sensor voltage being responsive to the current from the transistor device; and controlling a duty cycle of the sensor component with a sense control circuit according to a duty cycle ratio which is a portion of a total measurement period for which the sensor component is activated.

16. The method of claim 15, further comprising selecting a resistance value of an adjustable resistance component in response to a level of the current received at the interface, the sensor component comprising the adjustable resistance component.

17. The method of claim 16, further comprising automatically scaling the resistance in response to a magnitude value of the current, wherein the sense control circuit further comprises an automatic ranging device configured to control the automatic scaling.

18. The method of claim 17, further comprising switching the current to a resistor in the sense component on and off according to the duty cycle of the sensor component using the automatic ranging device.

19. The method of claim 17, further comprising triggering adjustment of the adjustable resistance component in response to an output voltage of the sensor component crossing a threshold set by a reference voltage.

* * * * *